(12) United States Patent
Lal

(10) Patent No.: US 8,658,993 B2
(45) Date of Patent: Feb. 25, 2014

(54) SELF-POWERED LITHOGRAPHY METHOD AND APPARATUS USING RADIOACTIVE THIN FILMS

(75) Inventor: Amit Lal, Ithaca, NY (US)

(73) Assignee: Cornell University, Ithaca, NY (US)

( * ) Notice: Subject to any disclaimer, the term of this patent is extended or adjusted under 35 U.S.C. 154(b) by 548 days.

(21) Appl. No.: 12/809,832

(22) PCT Filed: Dec. 22, 2008

(86) PCT No.: PCT/US2008/013958
§ 371 (c)(1),
(2), (4) Date: Sep. 16, 2010

(87) PCT Pub. No.: WO2009/085240
PCT Pub. Date: Jul. 9, 2009

(65) Prior Publication Data
US 2011/0014572 A1   Jan. 20, 2011

Related U.S. Application Data

(60) Provisional application No. 61/008,596, filed on Dec. 21, 2007.

(51) Int. Cl.
*G21G 4/00* (2006.01)
(52) U.S. Cl.
USPC ............... 250/492.2; 250/492.1; 250/492.3; 250/493.1; 250/503.1; 250/505.1
(58) Field of Classification Search
None
See application file for complete search history.

(56) References Cited

U.S. PATENT DOCUMENTS

| | | | | |
|---|---|---|---|---|
| 3,582,656 A * | 6/1971 | Koehler | ............... | 250/370.01 |
| 3,711,326 A * | 1/1973 | Parry et al. | ............... | 427/5 |
| 5,051,596 A * | 9/1991 | Perlman | ............... | 250/458.1 |
| 5,285,302 A * | 2/1994 | Wu | ............... | 349/43 |
| 5,347,139 A * | 9/1994 | Barker et al. | ............... | 250/583 |
| 5,567,570 A * | 10/1996 | Rostoker et al. | ............... | 430/311 |
| 6,136,396 A * | 10/2000 | Gilmer | ............... | 428/36.5 |
| 6,215,243 B1 * | 4/2001 | Janning | ............... | 313/496 |
| 6,670,620 B1 * | 12/2003 | Okunuki | ............... | 250/492.2 |

(Continued)

FOREIGN PATENT DOCUMENTS

JP          10275754 A  * 10/1998  ............. H01L 21/27

OTHER PUBLICATIONS

Kim et al.; Crystallographic texture in pulsed laser deposited hydroxyapatite biceramic coatings; Acta Materialia 55 (2007) 131-139.

*Primary Examiner* — Andrew Smyth
(74) *Attorney, Agent, or Firm* — William Greener; Bond, Schoeneck & King, PLLC

(57) ABSTRACT

A self-powered 'near field' lithographic system 100 includes three primary components, namely, a thin film or emitter substrate 110 including a radioactive material (e.g., a radioisotope 112), a target substrate 120 which carries an energy-modifiable layer 122 (e.g., photo-resist) and a stencil (e.g., 130) that is either positioned between the emitter and target substrates fabricated upon and defined in the emitter substrate. The stencil is made from a material capable of blocking particles emitted through radioactive decay from the radioisotope of the emitter substrate. The stencil includes openings or vias 132 patterned to permit selective transmission of the particles emitted through radioactive decay from the radioisotope of the emitter substrate 110, and the stencil is preferably placed up against (or very close to) the target substrate 120.

25 Claims, 12 Drawing Sheets

(56) References Cited

U.S. PATENT DOCUMENTS

| | | | |
|---|---|---|---|
| 7,435,514 B2* | 10/2008 | Hyde et al. | 430/5 |
| 2003/0143523 A1* | 7/2003 | Kato et al. | 435/4 |
| 2006/0124866 A1* | 6/2006 | Hisatsugu | 250/492.2 |
| 2006/0138360 A1* | 6/2006 | Martin | 250/493.1 |
| 2006/0261325 A1 | 11/2006 | Zanrosso et al. | |
| 2006/0264016 A1* | 11/2006 | Hyde et al. | 438/542 |
| 2007/0099334 A1* | 5/2007 | Kaneko | 438/99 |

* cited by examiner

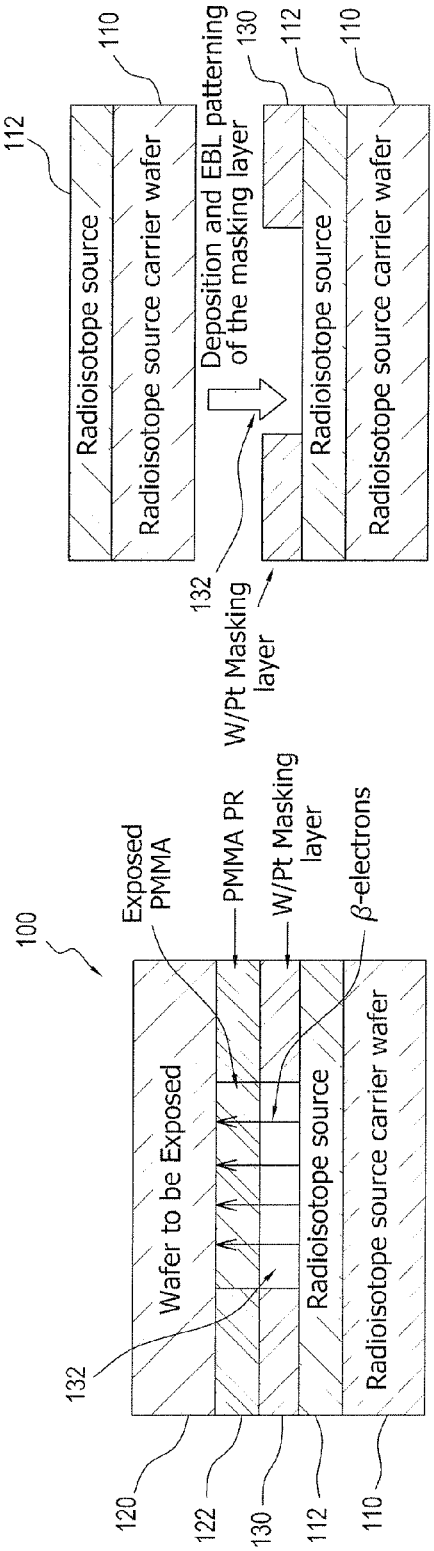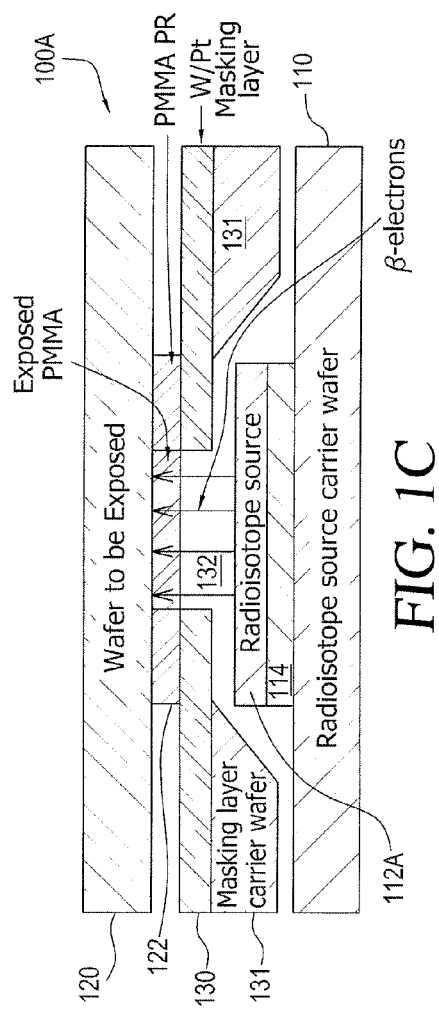
FIG. 1A
FIG. 1B
FIG. 1C

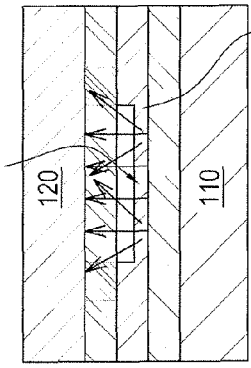
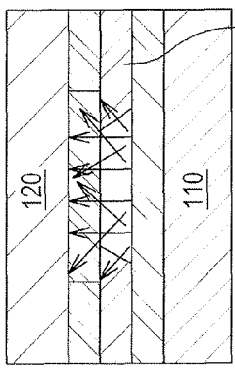
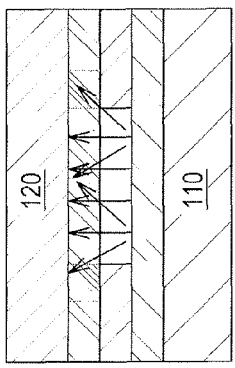
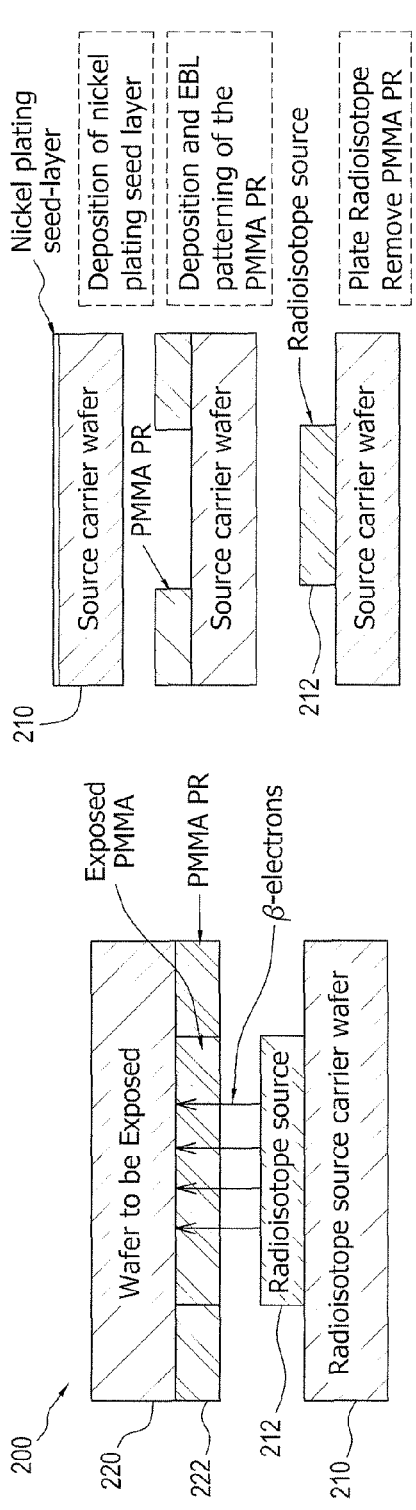

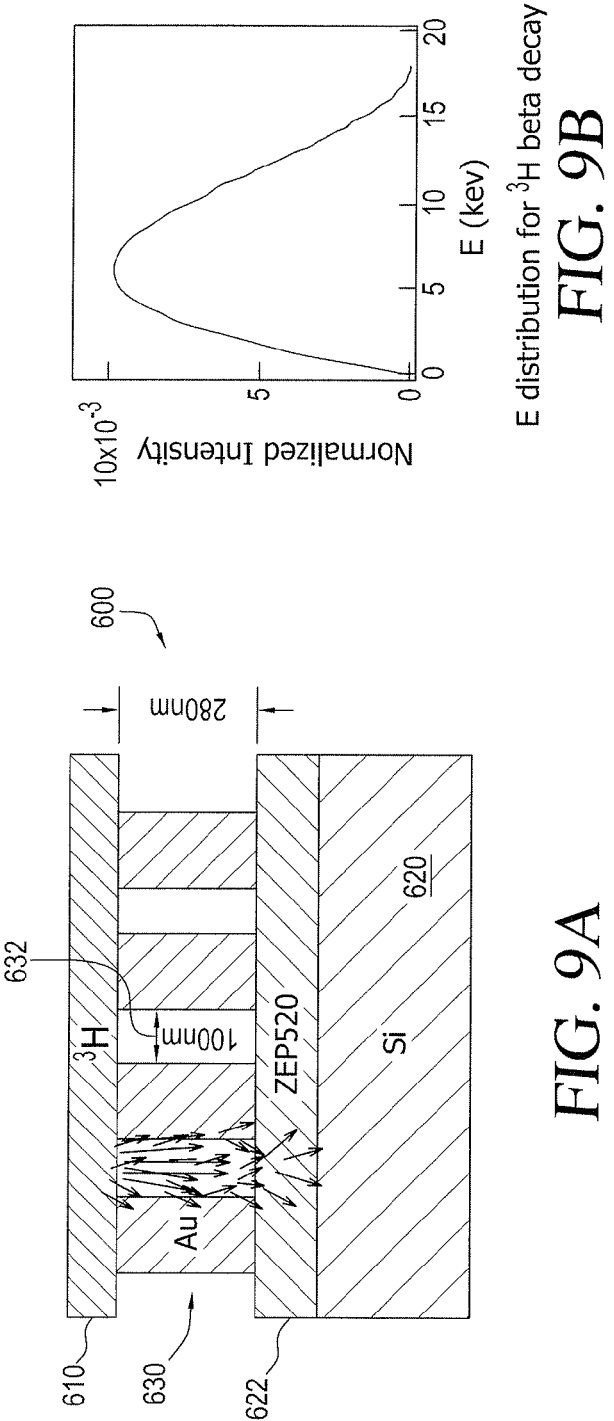

SELF-POWERED LITHOGRAPHY METHOD AND APPARATUS USING RADIOACTIVE THIN FILMS

PRIORITY CLAIM AND REFERENCE TO RELATED APPLICATION

This application claims priority to related and commonly owned U.S. provisional patent application No. 61/008,596, filed Dec. 21, 2007, the entire disclosure of which is incorporated herein by reference.

BACKGROUND OF THE INVENTION

1. Field of the Invention

The present invention relates to methods for fabricating semiconductor circuitry or nano-scale electro-mechanical systems and provides a cost-effective alternative to standard photolithography or electron beam lithography.

2. Discussion of Related Art

Semiconductors and nano-scale electro-mechanical systems have traditionally been produced using processes such as standard photolithography or electron beam lithography, each of which require significant investment in capital equipment and related facilities.

Thin film processing is a cornerstone of modern integrated circuit industry. All integrated circuits consist of successive deposition and removal of thin film materials. Deposition techniques include spin-coating, chemical vapor deposition and atmospheric or low pressures, evaporation, sputtering, reactive ion deposition. Thin film removal methods include, wet chemical etching, plasma reactive and/or physical etching. IC industry furthermore relies extensively on optical and less-so on electron lithography to define patterns in photo resist. In many of these methods, use of high energy charged and neutral particles is inherently required. In reactive ion sputtering, gases are ionized to create plasma the ionic species of which react with a surface to remove atoms. In evaporation, a material is heated by direct resistive heating or by electron-beam bombardment. In sputtering, accelerated ions bombard surfaces to remove materials. In lithography, the high energy electrons impinge on photo-resist to break or strengthen bonds in positive and negative resists respectively. These bonds are successively exposed to chemicals that remove the exposed or unexposed areas for positive and negative photo-resists respectively.

Electron beam lithography (EBL) is currently the state-of-the-art technique for creating patterns with 20-50 nm minimum feature size. However, EBL systems are expensive to procure (millions of dollars) and maintain (>$100,000/year). Furthermore, since they use raster scanning of 0.1-10 nA/cm$^2$ electron beams to expose patterns, they require long exposure times to deposit the 100-1000 μC/cm$^2$ doses needed for developing the EBL photo resists (See, for example, P. Rai-Choudhury, "Handbook of Microlithography, Micromachining, and Microfabrication" Volume 1: Microlithography, SPIE Press Monograph Vol. PM39). This results in a high cost/run of ~$10,000 for exposing areas as small as 1 mm$^2$.

In contrast, advanced optical lithography techniques employed in the semiconductor industry can result in cost effective exposure of large areas with minimum feature sizes 40-60 nm. However, optical lithography also requires high capital costs, and the cost of exposure tools and specialized masks (millions of dollars) makes optical lithography unsuitable for R&D and low volume production. Hence, e-beam and optical lithography fail to provide cost-effective lithography solutions to enable truly cost-effective micro or nano-scale systems.

The prior art methods for lithography use e-beams or image projection to expose a photo-resist layer modified by exposure to the e-beam or the projected light impinging on the photo-resist from a distant source. The e-beam and image projector are "far-field" sources of photo-resist modifying energy, and so require columns of vacuum which are expensive to create and maintain.

This has spawned other approaches, including the "active mask" approach of Hyde et al in US App number 20060264016, which posits that "greater resolution may be achievable using contact methods, in which a mask is placed in contact with a substrate." Hyde's lithographic mask includes a patterned energy emitting layer with an active region that emits an energy flux (e.g., light) at a selected level in response to an electrical input, and at least one inactive region that does not emit light in response to the electrical input. Hyde's lithographic method includes generating an energy (e.g., light) flux and exposing a flux sensitive material (e.g., photo resist or a lipid bilayer) to the energy flux to modify the flux sensitive material. Hyde's patterned energy emitting layer can include an array of light emitting diodes or electrodes which are activated or energized in a static or dynamically changeable pattern. Hyde's patterned energy emitting layer thus requires a separate power supply or source for energy to activate the active mask's light emitting diodes (or other energy emitting source) for "flux" emitted from the active mask.

Hyde's description of how to make and use the active mask is somewhat lacking in detail, however, and so persons of skill in these arts will be forced to engage in substantial development work if a practical, working "contact" lithography system (e.g., for semiconductor fabrication) is needed.

There is a need, therefore, for an inexpensive system and method enabling fast and low-cost nano-lithography (20-50 nm minimum feature size) on large areas (1-100 cm$^2$) to realize low-cost nano-scale systems.

SUMMARY OF THE INVENTION

The structures and methods of present invention overcome the above mentioned difficulties by providing a practical, working "contact" lithography system, which enables fast and low-cost nano-lithography (e.g., 20-50 nm minimum feature size) on large areas (e.g., 1-100 cm$^2$ or larger) to realize low-cost nano-scale systems.

In accordance with the present invention, a novel low-cost "contact" lithography system utilizes energetic particles (e.g., electrons) emitted spontaneously by radioisotope thin-films to expose an energized particle sensitive photo resist surface. By "photo resist" the applicant refers to a modifiable layer of the kind currently employed in conventional electron beam lithography systems. The particle (e.g., electron) emission from the this film's radioisotopes is masked using nano-stencils patterned as for use in conventional electron beam lithography, and the radioisotope-stencil stack is used to expose a large number of wafers without incurring any additional cost. This apparatus and method enable fast and low-cost (<$10,000) nano-lithography (20-50 nm minimum feature size) on large areas (1-100 cm$^2$) to realize low-cost nano-scale systems.

As noted above, prior art methods for lithography use e-beams or image projection to expose a photo-resist layer, which is modified by exposure to the e-beam or the projected light, both impinging on the photo-resist from a distant source; and these are considered to be "far-field" sources of photo-resist modifying energy. Prior art lithography systems thus require columns of vacuum which are expensive to create and maintain.

The method of the present invention is analogous to placing a negative on photo-printing paper to make a "contact print" or "proof sheet" in conventional photographic print making, and, in the present invention, the source for the photo-resist modifying energy is placed on a patterned stencil or mask, which is in turn placed upon or very near the photo-resist, in the "near field." The source for that energy is also self-powered, requiring zero power from an outside power supply. Advantageously, the source for the photo-resist modifying energy is an emitter thin film or substrate which includes radioactive material that generates a steady flow of energized particles (e.g., beta particles or energized electrons) which pass through pre-defined apertures or vias in a nano-patterned stencil and then into the modifiable (e.g., photo-resist) layer on a target substrate, modifying the photo resist in the exposure pattern defined by the stencil. This lithography method does not require the use of a vacuum chamber, since these steps can be performed in an ambient atmosphere.

The method and structure of the present invention include the emitter substrate and patterned stencil which can optionally be laminated or fastened together for re-use on successive target substrates (e.g., also coated with photo resist) to generate many exposed or modified target substrates having the selected exposure pattern for use in an economical automated process.

The lithographic system of the present invention includes three primary components, namely, an emitter thin film or substrate including the radioactive material (e.g., a radioisotope), a target substrate which carries the energy-modifiable layer (e.g., photo-resist), and a stencil sandwiched or positioned between the emitter substrate and target substrate. The pattern-defining stencil is made from a material capable of blocking particles emitted through radioactive decay from the radioisotope of the emitter substrate. The stencil pattern is defined by openings or vias arranged to permit selective transmission of the particles emitted through radioactive decay from the radioisotope of the emitter substrate, and the stencil is placed up against (or very close to) the target substrate.

The lithography method of the present invention uses radioisotope emitted particles to expose a target substrate which can be used in fabricating semiconductor circuits or micro- and nano-scale electro-mechanical devices. The stencil is positioned between the emitter substrate and the target substrate to be exposed so that particles emitted from the emitter substrate's radioisotope will impinge upon the stencil and, for those target substrate regions uncovered by openings or vias in the stencil, the target substrate. The stencil and the target substrate can be fixed in relative position to one another so that particles emitted through radioactive decay from the emitter's radioisotope selectively expose portions of the target substrate. It is conceivable that the emitter substrate could move, relative to the stencil and the target—only the stencil and target need to be locked together during exposure, because if the stencil moves, relative to the target, then the exposed pattern in the target's photo resist will be blurred. Interestingly, if the emitter substrate is moved relative to the stencil during photo-resist exposure, there is unlikely to be an adverse effect, because the direction of particle emission is random, so it won't matter if the emitter substrate moves, so long as the emitted particles can still impinge upon the target substrate. The relative positions of the emitter substrate, the stencil and the target substrate must be maintained for a pre-defined exposure period or interval lasting for the duration necessary for the particles emitted through radioactive decay from the radioisotope of the emitter substrate to achieve a desired modifying effect on the target substrate (e.g., adequate exposure of photo resist on the target substrate).

The above and still further objects, features and advantages of the present invention will become apparent upon consideration of the following detailed description of a specific embodiment thereof, particularly when taken in conjunction with the accompanying drawings, wherein like reference numerals in the various figures are utilized to designate like components.

DESCRIPTION OF THE FIGURES

FIG. 1A is a schematic cross sectional diagram, in elevation, of a zero-power lithography system, in accordance with the present invention.

FIG. 1B is a schematic cross sectional diagram, in elevation, illustrating fabrication of the masked electron emission source for the zero-power lithography system of FIG. 1A, in accordance with the present invention.

FIG. 1C is a schematic cross sectional diagram, in elevation, of a zero-power lithography system having a target wafer or substrate to be exposed, a stencil on a different carrier wafer and an emitter wafer or substrate carrying a radioisotope source, in accordance with the present invention.

FIGS. 2A-2D are schematic cross sectional diagrams, in elevation, illustrating, for the lithography system (a) ideal exposure, (b) exposure details for isotropic emission of electrons, (c) exposure with negative profile masking sidewalls and (d) different thicknesses of pattern openings for 0-60 keV electrons, in accordance with the present invention.

FIG. 3A is a schematic cross sectional diagram, in elevation, illustrating the zero-power lithography system with a patterned radioactive source, in accordance with the present invention.

FIG. 3B is a schematic cross sectional diagram, in elevation, illustrating fabrication of the patterned electron emission source, in accordance with the present invention.

FIG. 9A is schematic cross sectional diagram, in elevation, illustrating a direct contact lithography system using a $^3H$ thin film emitter and an Au stencil or mask to provide sub-100 nm features, using the method of the present invention.

FIG. 9B is a plot of E distribution for the beta decay of the $^3H$ thin film emitter of FIG. 9A, in accordance with the method of the present invention.

DETAILED DESCRIPTION OF ILLUSTRATED EMBODIMENTS

Figure 4:
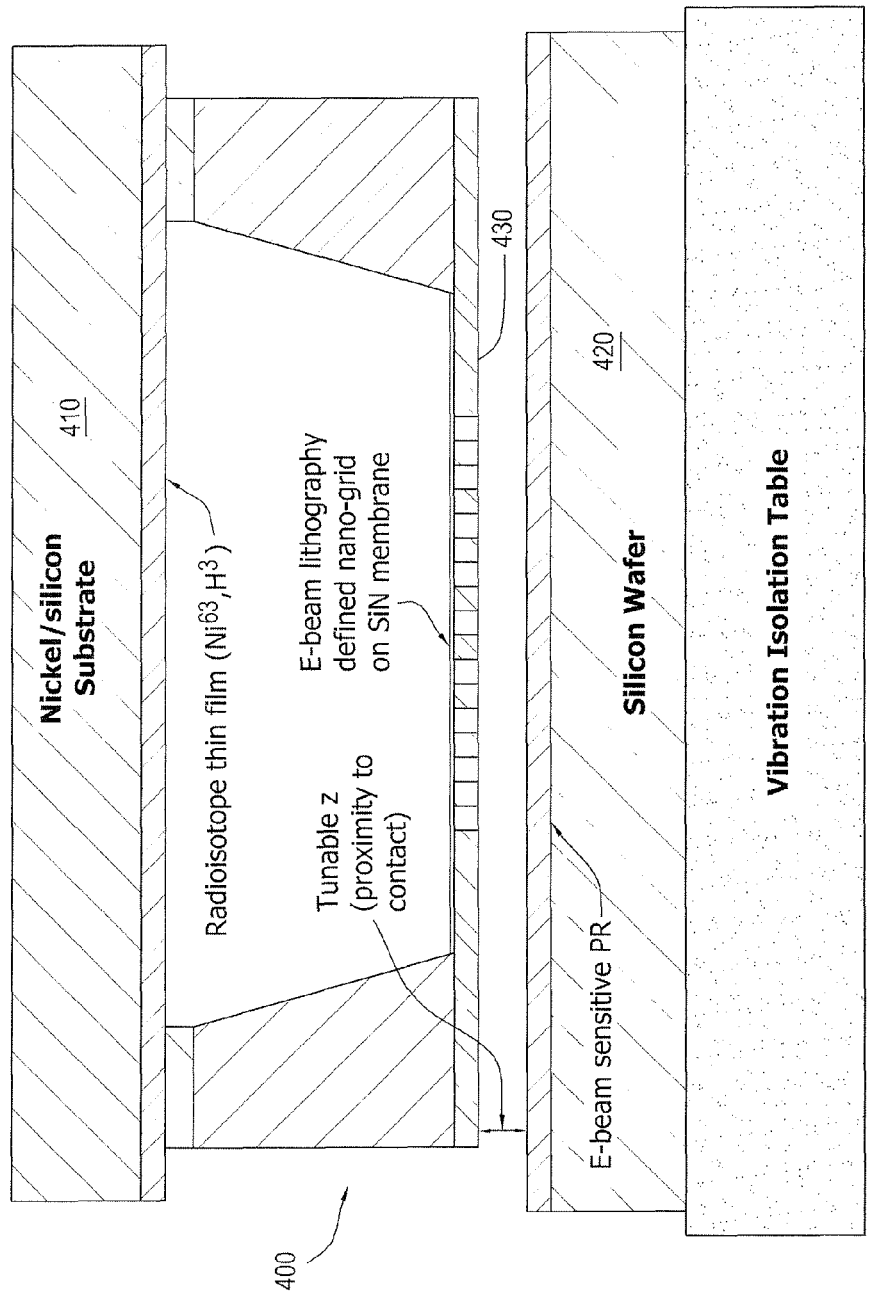
FIG. 4 is a schematic cross sectional diagram, in elevation, illustrating the experimental setup for validating models of beta particle penetration in Photo Resist ("PR") and shadowing effects due to the thickness of the stencil or mask layer, in accordance with the present invention.

Turning now to FIGS. 1A-10E, in accordance with the present invention, a lithographic system 100 includes three primary components, namely, an emitter thin film or substrate 110 including the radioactive material 112 (e.g., a radioisotope), a target substrate 120 which carries the energy-modifiable layer 122 (e.g., photo-resist), and a stencil or mask 130 sandwiched or positioned between emitter substrate 110 and target substrate 120. Pattern-defining stencil 130 includes a non-transmissive material (e.g., a heavy metal masking layer made from such as a W/Pt) capable of blocking particles emitted through radioactive decay from radioisotope 112 of the emitter substrate 110.

Stencil 130 defines a pattern having openings or vias arranged to permit selective transmission of the particles emitted through radioactive decay from the radioisotope of the emitter substrate 110, and stencil 130 is placed up against (or very close to) the target substrate, as shown in FIG. 1A, a schematic cross sectional diagram, in elevation, of zero-power lithography system 100.

A masked emitter substrate 110 carries an attached masking layer or stencil 130, and which is fabricated in-situ by deposition of a non-transmissive material (e.g., W/Pt) to define an exposure pattern having vias or openings 132 which permit particle emissions to pass. FIG. 1B is a schematic cross sectional diagram, in elevation, illustrating fabrication of the masked electron emission source 110 for the zero-power lithography system of FIG. 1A.

FIG. 1C is a schematic cross sectional diagram, in elevation, of a slightly different zero-power lithography system 100A having a target wafer or substrate to be exposed 120 placed near or against stencil or masking layer 130 which is affixed to and carried on a separate carrier wafer 131 which is separate from and movable in relation to emitter wafer or substrate 110 carrying a radioisotope source 112, in accordance with the present invention.

Energy-modifiable layer 122 can comprise a standard photo-resist material as is now in use in semiconductor fabrication (e.g., PMMA Photoresist or ZEP520 Photoresist) or can include other positive or negative photo-reactive materials which are modified by exposure to the energized particles or x-rays from emitter substrate 110, and then are subsequently processed in an etching step of another pattern-setting step for lithographic pattern transfer to the target substrate.

Target substrate can be made of SiO2, glass, silicon or any other substrate material that can be usefully modified with a pattern that is transferred by lithography, and can be quite small, as for use in semiconductor electronic circuits and MEMS or NEMS mechanical structures, or quite large, as when a pattern is transferred to a substrate for use in a large flat panel display or the like.

The "contact" lithography system 100 utilizes energetic particles (e.g., electrons) emitted spontaneously by radioisotope thin-films (e.g., radioisotope source 112) to expose energized particle sensitive surface 122. For purposes of nomenclature, the applicant uses the word "photo resist" to indicate a modifiable layer of the kind currently employed in conventional electron beam lithography systems, as well as any equivalents which may serve the same purpose now or in the future.

The particle (e.g., electron) emission from the thin film's radioisotopes is masked using nano-stencil 130 patterned as for use in conventional electron beam lithography, and the radioisotope-stencil stack (e.g., as shown in FIG. 1A is readily used to expose a large number of target substrates or wafers 120 without incurring any additional cost. This apparatus and method enable fast and low-cost (<$10,000) nano-lithography (20-50 nm minimum feature size) on large areas (e.g., 1-100 cm$^2$) to realize low-cost nano-scale systems.

The method of the present invention is analogous to placing a negative on photo-printing paper to make a "contact print" or "proof sheet" in conventional photographic print making, and, in the present invention, emitter substrate 110, the source for the photo-resist modifying energy is placed on patterned stencil or mask 130, which is in turn placed upon or very near the photo-resist 122, in the "near field." The source for that energy is continuously self-powered, requiring zero power from an outside power supply for an extended duration or useful life.

Advantageously, the photo-resist modifying energy is emitted from a thin film or substrate which includes radioactive material 112 that generates a steady flow of energized particles (e.g., beta particles or energized electrons) which pass through pre-defined apertures or vias 132 in nano-patterned stencil 130 and then into the modifiable (e.g., photo-resist) layer 122 on target substrate 120, modifying the photo resist in the exposure pattern defined by stencil 130. This lithography method does not require the use of a vacuum chamber, since these steps can be performed in air.

The emitter substrate 110 and patterned stencil 130 can optionally be laminated or fastened together for re-use on successive target substrates (e.g., also coated with photo resist) to generate many exposed or modified target substrates having the selected exposure pattern for use in an economical automated process.

The lithography method of the present invention uses radioisotope emitted particles to expose a target substrate 120 which can be used in fabricating semiconductor circuits or micro- and nano-scale electro-mechanical devices. Stencil 130 is positioned between emitter substrate 110 and target substrate 120 to be exposed so that particles emitted from the emitter substrate's radioisotope 112 will impinge upon stencil 130 and, for those target substrate regions uncovered by openings or vias 132 in the stencil, the particles impinge upon the target substrate 120.

Stencil 130 and target substrate 120 can be fixed in relative position to one another so that particles emitted through radioactive decay from the emitter's radioisotope 112 selectively expose and modify portions of the target substrate 120.

It is conceivable that emitter substrate 110 could move relative to stencil 130 and target 120- only stencil 130 and target 120 need to be locked together during exposure, because if stencil moves 130 relative to target 120 then the exposed pattern in the target's photo resist (or other modifiable layer) 122 will be blurred. Interestingly, if emitter substrate 110 is moved relative to stencil 130 during photo-resist exposure, there is unlikely to be an adverse effect, because the direction of particle emission is random, so it won't matter if the emitter substrate moves, so long as the emitted particles can still impinge upon the target substrate. The relative positions of the emitter substrate, the stencil and the target substrate must be maintained for a pre-defined exposure period or interval lasting for the duration necessary for the particles emitted through radioactive decay from the radioisotope of the emitter substrate to achieve a desired modifying effect on the target substrate (e.g., adequate exposure of photo resist or other modifiable layer 122).

Low-cost lithography systems, in accordance with the present invention as shown in FIGS. 1A-3B, utilize the energetic electrons emitted spontaneously by radioisotope thin-films to expose conventional electron sensitive photoresists as used currently in EBLs (see FIG. 1B). The method and apparatus of the present invention eliminates the expensive processes of electron beam generation and precision steering by using safe low-activity radioisotope thin-films that are expected to cost less than $10,000.

The contact method and near field system of the present invention will simultaneously expose all the features to be patterned on an entire wafer, thus making it a parallel exposure of features, as opposed to the serial exposure of features in the currently used EBL method of raster scanning, hence making exposure of large patterns faster.

Lithography system 100 can be realized by first depositing a thin-film of a suitable radioisotope 112 on a carrier wafer 114 (FIG. 1C). An exemplary radioisotope for deposition is Pm-147, which is favorable because its electron emission characteristics (0.1-10 nA/cm$^2$ @ 63 keV average) closely match the electron beam characteristics of EBLs (See, for example, P. Rai-Choudhury, "Handbook of Microlithography, Micromachining, and Microfabrication" Volume 1: Microlithography, SPIE Press Monograph Vol. PM39). Hence, presently available EBL photoresists (e.g., PMMA PR as shown in FIG. 1A) can be employed without any further development.

The radioisotope thin film deposition is followed by the deposition of a thin layer of a heavy metal (e.g., a W/Pt masking layer, as shown in FIG. 1A) that is thick enough to block the emitted β-electrons from the radioisotope source or emitter 110.

Subsequently, the high-resolution pattern to be finally written onto the device wafers is written onto the heavy-metal masking or stencil layer 130 using EBL.

Stencil 130 can then be used to expose a large number of wafers without incurring additional cost (see Table 1, below).

TABLE 1

Comparison of exposure attributes of the proposed system with EBL systems. The data on EBLs is derived from experience in the Cornell Nanofabrication Facility.

|  | E-Beam | Pm-147 | Nickel-63 |
|---|---|---|---|
| $E_{avg}$ (keV) | 10-100 | 63 | 17.3 |
| Specific activity (Curie/g) | NA | 500 | 15 |
| Density (g/cc) | NA | 6.5 | 8.9 |
| Optimal thickness of radioisotope, for >50% emission efficiency (μm) | NA | 10 | 5 |
| Radioisotope Activity (Curies) | NA | 3.25 | 0.06675 |
| Current Output (nA/cm$^2$) | 1-10 | 7.215 | 0.148 |
| Exposure time required/cm$^2$ @ 100 μC/cm$^2$ dose (hours) | 2.7-27 | 3.85 | 187.45 |
| Exposure time required/cm$^2$@ 1000 μC/cm$^2$ dose (hours) | 27.7-277.7 | 38.5 | 1874.57 |
| Exposure time required for 100 cm$^2$ @ 100 μC/cm$^2$ dose (hours) | 277.77-2777.77 | 3.85 | 187.437 |
| Exposure time required for 100 cm$^2$ @ 1000 μC/cm$^2$ dose (hours) | 2777.77-27777.77 | 38.5 | 1874.37 |

Stencil or mask 130 can then be stripped, and radioisotope source 112 possibly reused with other stencils for writing other patterns.

An alternative lithography system 200 in accordance with the present invention uses an emitter substrate 210 carrying a patterned radioactive film 222 instead of patterned heavy metal mask 130 (see FIGS. 3A and 3B). For the embodiments of FIGS. 3A and 3B, first a radioactive thin film 212 is deposited by various mechanisms (e.g., electrodeposition, sputtering, evaporation, etc.) on a conductive glass or silicon wafer or substrate 210. This film could be polished using various techniques including chemo mechanical polishing to achieve sub-nm level smoothness.

For embodiments that will include a direct contact mask or stencil layer (e.g., 130 or 530), next, a second film layer is deposited. This second film layer will preferentially mask or (block transmission of) the electrons, x-rays, or alpha particles being emitted from the radioactive thin films. Although almost any conductive material could be placed, some desirable attributes are useful. First this material should be hard and adhere well to the radioactive thin film. The material should be highly durable as it is likely to contact resists multiple times. The material should have a high stopping power for the particles. A good candidate material is high atomic number and density metals such as platinum, tungsten, or molybdenum. The typical thickness required for this film will be governed by the following two tradeoffs. On one hand the film should be as thick as possible to create maximum contrast of particle flux into photo-resist (e.g., such as 122, 222, 422 or 522). On the other hand, as thickness increases, the maximum aspect ratio of etched lines in the material will limit how small a feature size can be obtained with the material. For an aspect ratio of 10:1 and a desired minimum dimension of 20 nm, a thin film of 200 nm is required. With a desired feature size of 50 nm, one can possibly have a film of 500 nm. These are realistic film thicknesses. To increase the absorption of the emitted electrons in the material, one can use atomic epitaxy techniques to realize Bragg reflection gratings for the electrons. For example, since electron wavelength at 30 keV is sub Angstrom, periodic structures of different metals with Angstrom-scale periodicity could result in most of the electrons or β-rays reflected back into the radioactive film. The multilayer stack or the single metal layer will be next etched to define the mask pattern. This can be done with ion-beam patterning or by standard lithography with e-beam or deep-uv patterning. In the case of e-beam lithography, the residual electrons from the radioactive thin film could cause the top PR 222 to develop. Hence a PR material with a high nonlinear contrast maybe needed. The peak energy emitted from the radioactive thin film or emitter 212 can also be shifted to lower energies by depositing a thin film for energy absorption.

This work is on-going, and one possible challenge to overcome is the shadow exposure of the photo resist (e.g., 122 or 222) due to the isotropic emission of electrons from radioisotopes. This can possibly be eliminated by using masking layers with negative profile sidewalls (see 130N in FIG. 2C). Electro-deposition techniques, which result in the mushroom effect when the deposited metal is thicker than the masking photo resist layer, can possibly used to generate sidewalls with negative profile. Selected mask layer thickness can also be used to alter absorption of emissions through the mask or stencil (see 130T in FIG. 2C)

Additional background information available to those having skill in the art is found in the following reference works: [1] P. Rai-Choudhury, "Handbook of Microlithography, Micromachining, and Microfabrication" Volume 1: Microlithography, SPIE Press Monograph Vol. PM39; and [2] web content available in the following NIST publication: http://physics.nist.gov/PhysRefData/Star/Text/ESTAR.html.

Proof of Concept Experiments

Exposure to Emitted Electrons Through Micromachined Mask:

Turning now to a description of the development effort behind the method and system of the present invention, FIG. 4 is a schematic cross sectional diagram, in elevation, illustrating the experimental lithography system 400 for validating models of beta particle penetration in Photo Resist ("PR") and shadowing effects due to the thickness of the stencil or mask layer, in accordance with the present invention. Initial experiments using an emitter substrate 410 carrying a planar Ni-63 thin film demonstrated that a 10-milli-Ci/cm² radiation activity is achieved from these films. The experiments were done with the setup shown in FIG. 4. The $Si_xN_y$ membrane is fabricated using traditional bulk-micromachining techniques combined with e-beam based lithography to define a stencil 430 with nanoscale apertures (simple holes, squares, rect- angles, etc.). The stress in the SiN film was considered likely deform the nanoscale apertures. In order to form a good comparison between the apertures and the pattern defined in the PR carried on target substrate 420, the stress induced curvature and aperture deformation was measured by scanning the aperture area with optical and probe based metrology techniques before exposure. The setup was placed on a vibration isolated platform (as shown in FIG. 4) to avoid any slippage between the wafer 420, the micromachined mask 430 and the nickel thin film emission source 410.

Direct Ni-63 contact exposure: Another experiment, illustrated in FIGS. 5A and 5B placed a Ni-63 thin film 512 directly in contact with the ZEP-10 e-beam resist layer 522. Here Ni-63 thin films were coated with thermally evaporated gold thin films through a nanoscale shadow mask 530 created with SiN membrane. The gold-Ni63 emitter substrate or chip 510 is configured for placement in direct contact with a plurality of target wafers 520 with photo resist 522. The Ni-63 thin films 512 were deposited on silicon chips from commercial vendors. Additionally an existing thermal evaporator was retrofitted to allow evaporation onto Ni-63 thin films. FIGS. 5A and 5B are schematic cross sectional diagrams, in elevation, illustrating development of a direct contact lithography system 500 including that Ni-63 thin film emitter 510 with stencil or mask 530.

Figure 5:
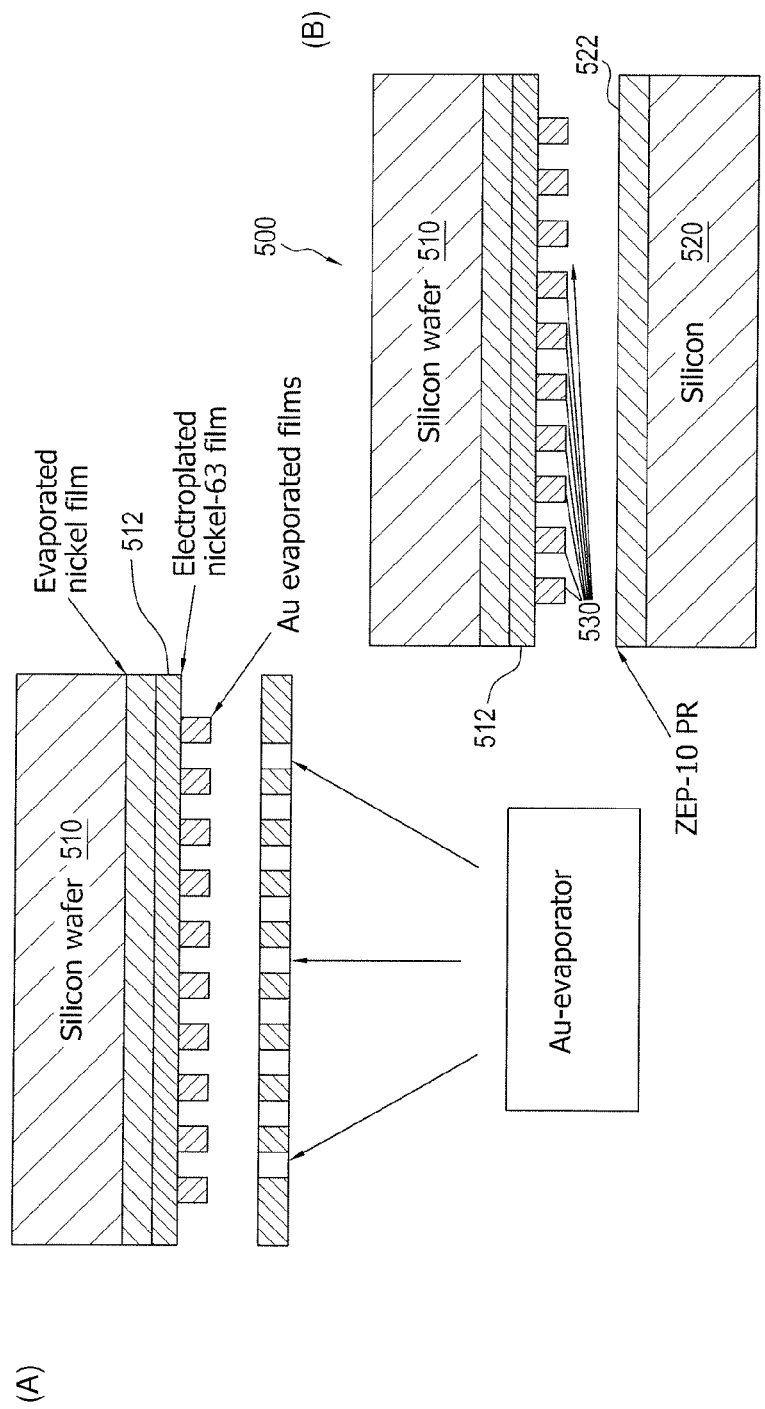
FIGS. 5a and 5b are schematic cross sectional diagrams, in elevation, illustrating development of a direct contact Ni-63 thin film emitter and stencil or mask for the experimental setup, in accordance with the present invention.

The setups of FIGS. 4-5B permitted repeated exposures to investigate the wear and abrasion issues with radioactive exposure masks. In addition, 4-inch radioactive thin film masks were developed to demonstrate large area nanoscale feature definition capability and investigate the aging of the masks. The applicant is also investigating ways to develop electroplating of high specific activity Pm-147 thin films and various process steps to realize active masks.

Figure 6:
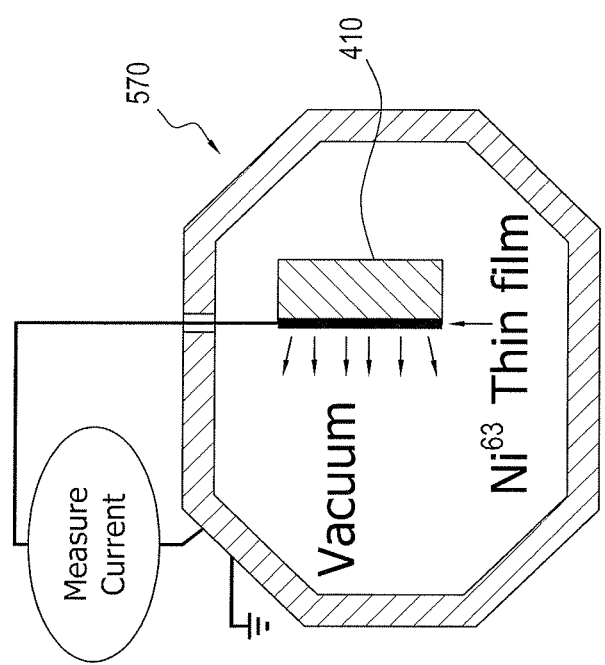
FIG. 6 is a schematic diagram illustrating the experimental setup for measuring flux current density from the Ni-63 thin film emitter, in accordance with the present invention.

The experimental work included measuring flux current density for an exemplary emitter substrate (e.g., 410) carrying a Ni-63 thin film, as shown in FIG. 6, which illustrates the experimental setup 570.

Figure 7B:
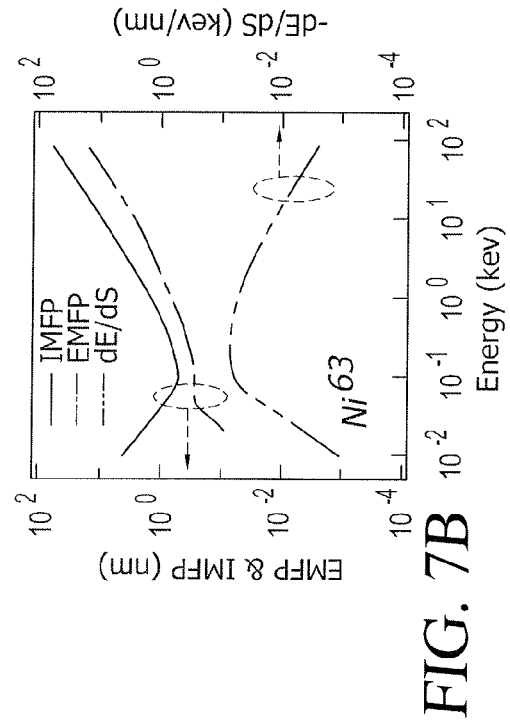
FIG. 7B illustrates plotted measured results for Elastic Mean Free Path (EMFP) vs. Energy, Inelastic Mean Free Path (IMFP) vs. Energy and Stopping Power vs. Energy curves for metal $Ni^{63}$, in accordance with the present invention.
Figure 7D:
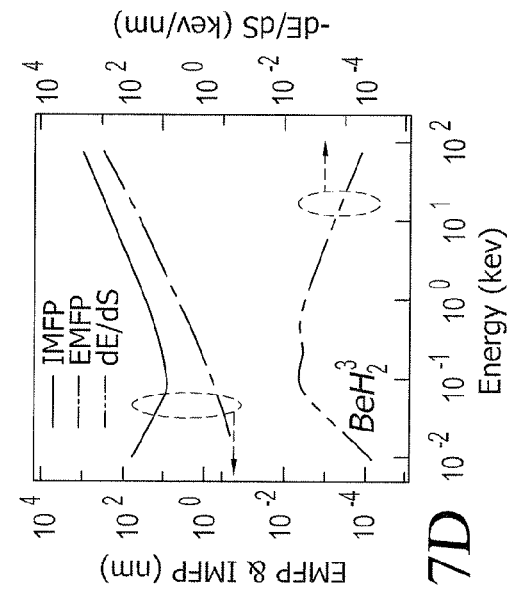
FIG. 7D illustrates plotted measured results for Elastic Mean Free Path (EMFP) vs. Energy, Inelastic Mean Free Path (IMFP) vs. Energy and Stopping Power vs. Energy curves for beryllium tritide ($BeH_2^3$), in accordance with the present invention.
Figure 7A:
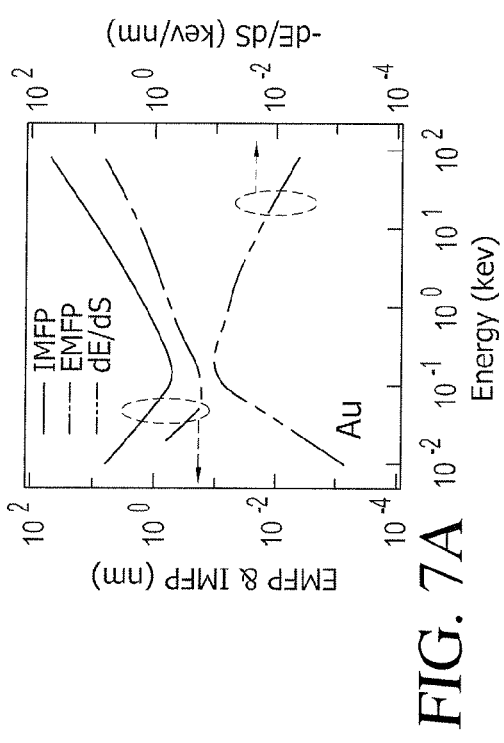
FIG. 7A illustrates plotted measured results for Elastic Mean Free Path (EMFP) vs. Energy, Inelastic Mean Free Path (IMFP) vs. Energy and Stopping Power vs. Energy curves for metal Au, in accordance with the present invention.
Figure 7C:
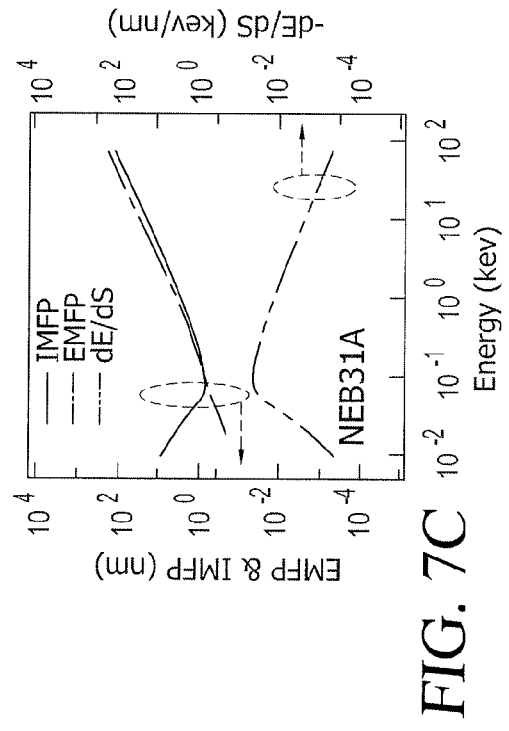
FIG. 7C illustrates plotted measured results for Elastic Mean Free Path (EMFP) vs. Energy, Inelastic Mean Free Path (IMFP) vs. Energy and Stopping Power vs. Energy curves for e-beam resist NEB31A, in accordance with the present invention.

The path for emitted particles was modeled and was measured during this development work, and this work also permitted development of masks or stencils (e.g., like 130, 230 or 430). FIG. 7A illustrates plotted measured results for Elastic Mean Free Path (EMFP) vs. Energy, Inelastic Mean Free Path (IMFP) vs. Energy and Stopping Power vs. Energy curves for metal Au; FIG. 7B illustrates plotted measured results for Elastic Mean Free Path (EMFP) vs. Energy, Inelastic Mean Free Path (IMFP) vs. Energy and Stopping Power vs. Energy curves for metal $Ni^{63}$; FIG. 7C illustrates plotted measured results for Elastic Mean Free Path (EMFP) vs. Energy, Inelastic Mean Free Path (IMFP) vs. Energy and Stopping Power vs. Energy curves for e-beam resist NEB31A; and FIG. 7D illustrates plotted measured results for Elastic Mean Free Path (EMFP) vs. Energy, Inelastic Mean Free Path (IMFP) vs. Energy and Stopping Power vs. Energy curves for beryllium tritide ($BeH_2^3$), in accordance with the present invention.

Theoretical Basis for Prototype Development

1. Fermi Theory.

From the Fermi theory of beta decay (see ref 1, below), the shape of the energy distribution for the allowed transition is given approximately by the expression:

$$N(E)=C(E^2+2Em_ec^2)^{1/2}(Q-E)^2(E+m_ec^2)F(Z,E)$$

Where c is speed of light, $m_e$ is electron rest mass, Z is the nuclear charge on the daughter nucleus, E is the kinetic energy of the emitted electrons, Q is the upper bound on the kinetic energy of the electrons. The Fermi function F(Z,E), accounts for the nuclear coulomb interaction that shifts this distribution toward lower energies due to the coulomb attraction between the daughter nucleus and the emitted electron. It is given by (2):

$$F(Z, E) = 2\pi\left(\frac{Ze^2c}{\hbar}\sqrt{\frac{m_e}{2E}}\right) \Big/ \left[1 - \exp\left(-2\pi\left(\frac{Ze^2c}{\hbar}\sqrt{\frac{m_e}{2E}}\right)\right)\right]$$

2. Monte Carlo Simulation.

The Monte Carlo electron trajectory simulation method has been extensively applied to electron probe micro- and nano-analysis using codes based on several available Monte Carlo models (see refs 3-5, below).

a. Elastic Scattering

Mott cross section was used to describe elastic scattering. For a compound material, with n elements, its total elastic mean free path (EMFP) $\lambda_e$ is determined by:

$$\lambda_e^{-1}(E) = \rho N_0 \sum_{i=1}^{n} \frac{C_i \sigma_e^i(E)}{A_i}$$

Where E is the kinetic energy of the incident electron, $\rho$ is the density of the region, $N_0$ is the Avogadro's constant, $A_i$, $C_i$ are the atomic weight and number fraction of element i, respectively. The Mott cross section value $\sigma_e^i$ of chemical element i is determined using the pre-calculated and tabulated value (6-7).

b. Inelastic Scattering

We used dielectric response theory to describe inelastic scattering. The electron inelastic differential cross section can be expressed by (8):

$$\frac{d^2\sigma}{d(\hbar\omega)dq} = \frac{1}{\pi a_0 E}\text{Im}[-1/\varepsilon(q,\omega)]\frac{1}{q}$$

Where $a_0$ is the Bohr radius, $\hbar\omega$ is the energy loss, $\hbar q$ is the moment transfer, E is the kinetic energy of the incident electron and $\in(q,\omega)$ is the dielectric response function.

The stopping power and the inelastic mean free path (IMFP) $\lambda_{in}$ are given by (5):

$$-\frac{dE}{dS}(E) = \frac{1}{\pi a_0 E}\int_0^{E/2}(\hbar\omega)\text{Im}[-1/\varepsilon(\omega)]ln\left\{\frac{\sqrt{E}+\sqrt{E-2\hbar\omega}}{\sqrt{E}-\sqrt{E-2\hbar\omega}}\right\}d(\hbar\omega)$$

$$\lambda_{in}^{-1}(E) = \frac{1}{2\pi a_0 E}\int_0^{E/2}\text{Im}[-1/\varepsilon(\omega)]ln\left\{\frac{1-\hbar\omega/2E+\sqrt{1-2\hbar\omega/E}}{1-\hbar\omega/2E-\sqrt{1-2\hbar\omega/E}}\right\}d(\hbar\omega).$$

The optical dielectric constant $\in(\omega)$ is related to the refractive index n and the extinction coefficient k by: $\in(\omega)=(n+ik)^2=(n^2-k^2)+i(2nk)$ The optical properties of materials in the photon energy range above about 30 eV can be described by the atomic scattering factors. The index of refraction of a material is related to the scattering factors of the individual atoms by:

$$n = 1 - \frac{r_e}{2\pi}\lambda^2\sum_i n_i f_1^i$$

$$k = \frac{r_e}{2\pi}\lambda^2\sum_i n_i f_2^i$$

where $r_e$ is the classical electron radius, $\lambda$ is the wavelength of the incident electron, and $n_i$ is the atom number volume density of element i, $f_1$, $f_2$ are the real and imaginary part of atomic scattering factor, respectively (9).

c. Monte Carlo Procedure and Programming

First we used three uniform random numbers [0, 1], $R_i$, to determine the beta particle coordinates $x_i^0$, initially generated in radioisotope thin film source with dimension size $D^i$ (i=1, 2, 3):

$$x_i^0 = R_i \cdot D_i$$

The initial energy of the beta particle is determined by another uniform random number $R_4$ by:

$$R_4 \leq \int_0^E N(E')dE'/\int_0^Q N(E')dE'$$

The initial angle distribution of the beta particle is assumed to be isotropic. So its initial moving direction angle $\theta^0$ and azimuthal angle $\phi^0$ are determined respectively by another two uniform random numbers $R_5$ and $R_6$ $$\theta^0 = \pi R_5, \phi^0 = 2\pi R_6$$

The total mean free path $\lambda_m$ is related to the corresponding elastic mean free path $\lambda_e$ and the inelastic mean free path $\lambda_{in}$ by:

$$\lambda_m^{-1} = \lambda_e^{-1} + \lambda_{in}^{-1}$$

The travel distance between two successive collisions is evaluated by another uniform random number $R_7$:

$$s = -\lambda_m ln(R_7)$$

After passing distance s, uniform random number $R_8$ is used to determine the type of next individual scattering event, elastic or inelastic, by:

if $R_8 < \lambda_e^{-1}/\lambda_m^{-1}$ is true, it is elastic, otherwise, it is inelastic.

For elastic scattering, we used uniform random number $R_9$ to determine the $i^{th}$ element atom, which would be responsible for this individual elastic scattering:

$$\frac{\sum_{j=1}^{i-1}\frac{C_j\sigma_e^j}{A_j}}{\sum_{j=1}^{n}\frac{C_j\sigma_e^j}{A_j}} < R_9 < \frac{\sum_{j=1}^{i}\frac{C_j\sigma_e^j}{A_j}}{\sum_{j=1}^{n}\frac{C_j\sigma_e^j}{A_j}}$$

The elastic scattering angle $\theta_e$ is determined by random number $R_{10}$:

$$R_{10} \leq \int_0^{\theta_e}\sigma_e \sin\theta'd\theta'/\int_0^{\pi}\sigma_e \sin\theta'd\theta'$$

The azimuthal angle $\phi^e$ is assumed to be isotropic and be determined by random number $R_{11}$:

$$\phi^e = 2\pi R_{11}$$

For inelastic scattering, the energy loss $\Delta E$ for this individual event is given by:

$$\Delta E = -\frac{dE}{dS} \cdot s$$

The inelastic scattering angle $\theta^{in}$ is predicated by a classical binary collision model:

$$\theta^{in} = \sin^{-1}(\Delta E/E)^{1/2}$$

The azimuthal angle $\phi^{in}$ is also assumed to be isotropic and be determined by random number $R_{12}$:

$$\phi^{in} = 2\pi R_{12}$$

The energy loss $\Delta E$ is considered to be transferred to the generated secondary electron, which will have initial energy $E_0^s = \Delta E + E_F$ for valence electron excitation or $E_0^s = \Delta E - E_B$ for ionization where $E_B$ is the binding energy (3). For electron beam resist exposure process simulation, since $\Delta E$ is pretty small, we assumed that this energy loss $\Delta E$ will be absorbed by the resist media locally, so that we could get the energy contour plot (see, e.g., FIGS. 7C and 7D).

3. Experiment Details.

a. Source Flux Current Density i Measurement

The radioactive $Ni^{63}$ thin film was deposited by electro-less nickel plating technique (10, 11), on a Ni/Silicon substrate that was pre-polished. The thin film source (e.g., such as 410, 1 cm×1 cm in size) flux current density i was measured using setup 570 by placing the source in a metal vacuum chamber, with pressure down to 1 E-5 Torr (see FIG. 6). The measured i value for our source was 12 pA/cm².

b. Mask Fabrication

A thin layer of $Si_3N_4$ film (~50 nm) was deposited on Silicon wafer by Low Pressure Chemical Vapor Deposition (LPCVD) at about 700° C. Then the nitride film was patterned by electron beam lithography and dry etching. The next step was to back etch through the silicon wafer to the silicon nitride layer. Then a layer of Au (10 nm Ti+500 nm Au) was deposited from the backside of the wafer, by metal evaporator at slow deposition rate (FIG. 2A).

c. E-Beam Resist Exposure and Development

Negative tone electron beam resist NEB31A (Zeon Corporation) thin film (120 nm in thickness) was spun on silicon wafer, with 8000 RPM spinning speed, followed by baking at 110° C. for 2 minutes. After that, we placed the Au mask (made above) on top of the NEB31A film, and then mounted the $Ni^{63}$ thin film source on top of the mask to expose the resist in air for seven days (168 hours) continuously (FIG. 2A), which was held in dark room due to the high sensitivity to white light of NEB31A resist. After exposure, we baked the wafer at 95° C. for two minutes, developed it in MF-321 for 30 seconds, followed by DI water rinsing and $N_2$ gun blow drying.

References

1. E. Fermi, *Zeits. f. Physik* 88, 161(1934).
2. P. Venkataramaiah et al., *Journal of Physics G: Nuclear and Particle Physics* 11, 359 (1985).
3. Z. Ding, R. Shimizu, *Scanning* 18, 92 (1996).
4. P. Hovingt on et al., *Scanning* 19, 29 (1997).
5. Z. Tan et al., *Applied Physics A* 81, 779 (2005).
6. Z. Czyzewski et al., *Journal of Applied Physics* 68, 3066 (1990).
7. D. Drouin et al., *Scanning* 19, 20 (1997).
8. D. Pines et al., *The Theory of Quantum Liquids*, New York (1966).
9. A. Thompson et al., *X-ray data booklet*, (2001).
10. G. O. Mallory et al., *Electroless Plating: Fundamentals and Applications* 1, 1 (1990).
11. M. Schlesinger et al., *Modern Electroplating (fourth edition)*, 667 (2000).

Prototype Lithographic System Pattern Feature Sizes

Figure 8:
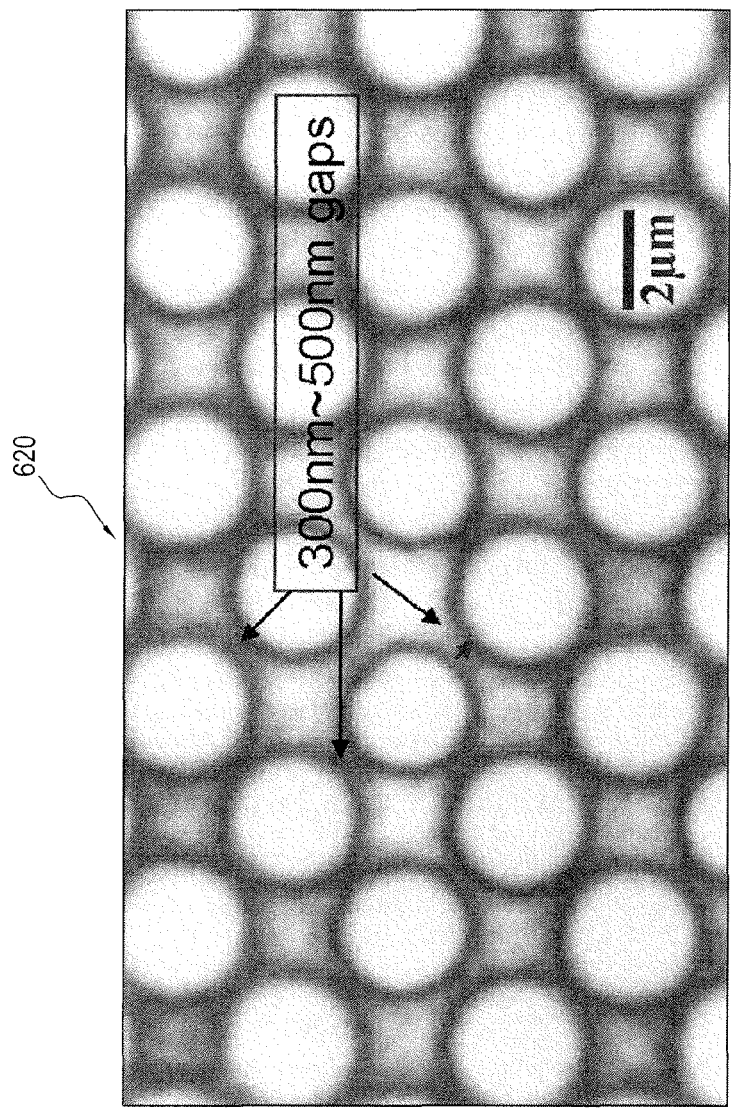
FIG. 8 is a microscope image of the pattern for a Si3N4 membrane grid, illustrating sub-micron resolution; the deposition of Au provides a pattern with 300-500 nm gaps and 2 μm features, in accordance with the present invention.

As shown in FIG. 8, a microscope image of a target substrate (e.g., 620, after removal of the exposed PR layer), the pattern for a Si3N4 membrane grid shows that the lithographic method of the present invention can provide sub-micron resolution. Deposition of Au provides a pattern with 300-500 nm gaps and 2 µm hole features. A batch of substrates including Au deposition on three new Si3N4 TEM membrane grids employed an evaporator with a relatively slow deposition rate of Au (1 A/s to 1.5 A/s). The deposition film was found to be relatively uniform under the microscope. Based on applicant's simulation work, it was discovered that smaller stencil holes give rise to a need for longer exposure times. These times can be substantially reduce dby the use of higher activity radioisotope sources.

For the illustrated pattern, NEB31 negative resist was exposed for ten days, whereupon the pattern was cleary visible. Ten day period was chosen to definitely obtain exposure, and the pattern was over-exosed. Hindsight would appear to indicate that, for this setup, eight days exposure is likely to provide a satisfactory pattern having 2 um holes (as in FIG. 8). Additional work appears likely to show improved patterns based on this SiNTEM grid+Au mask.

Figure 9C:
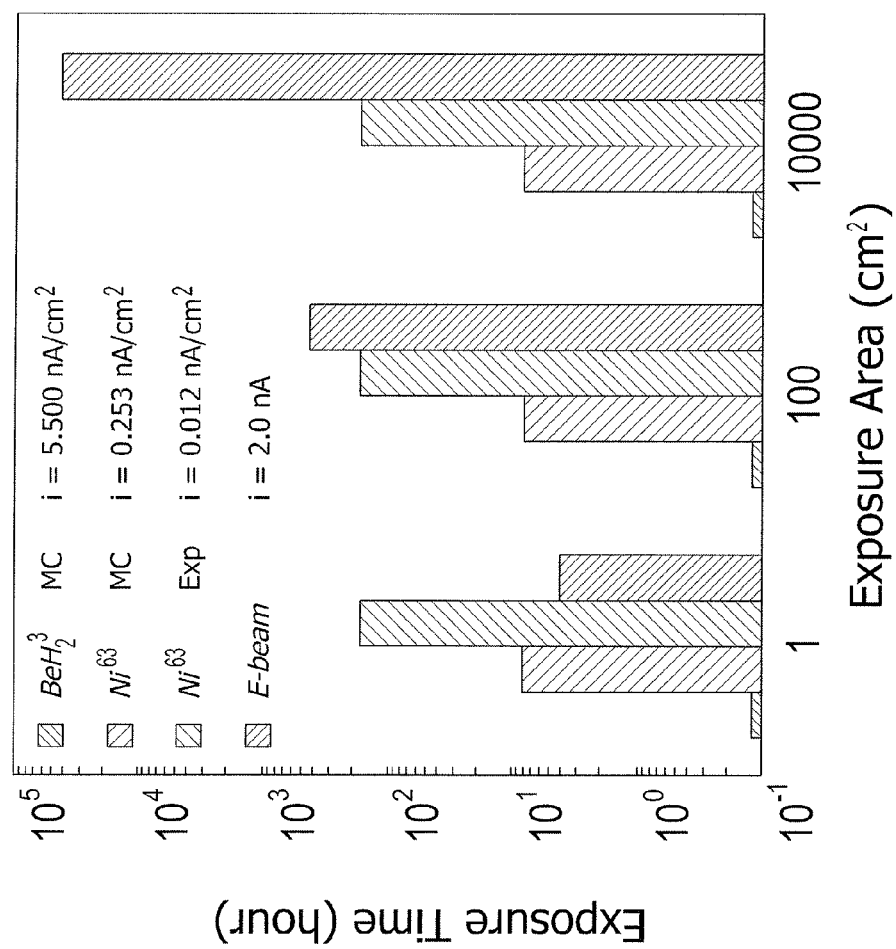
FIG. 9C is a histogram plot for exposure time as a function of exposure area, illustrating varying times with different isotopes, for use in evaluating throughput and cost, in accordance with the method of the present invention.
Figure 10A:
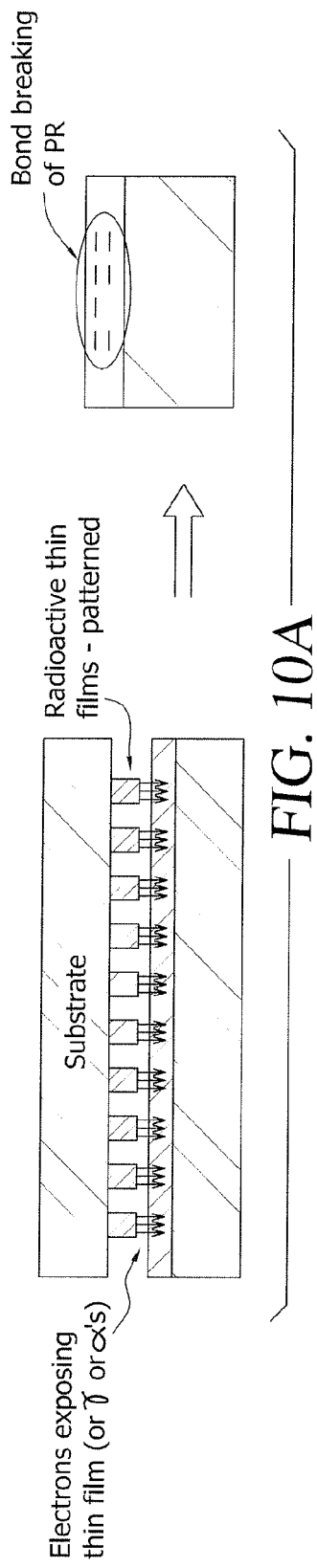
FIG. 10A is schematic cross sectional diagram, in elevation, illustrating an electron lithography system, in accordance with the method of the present invention.
Figure 10B:
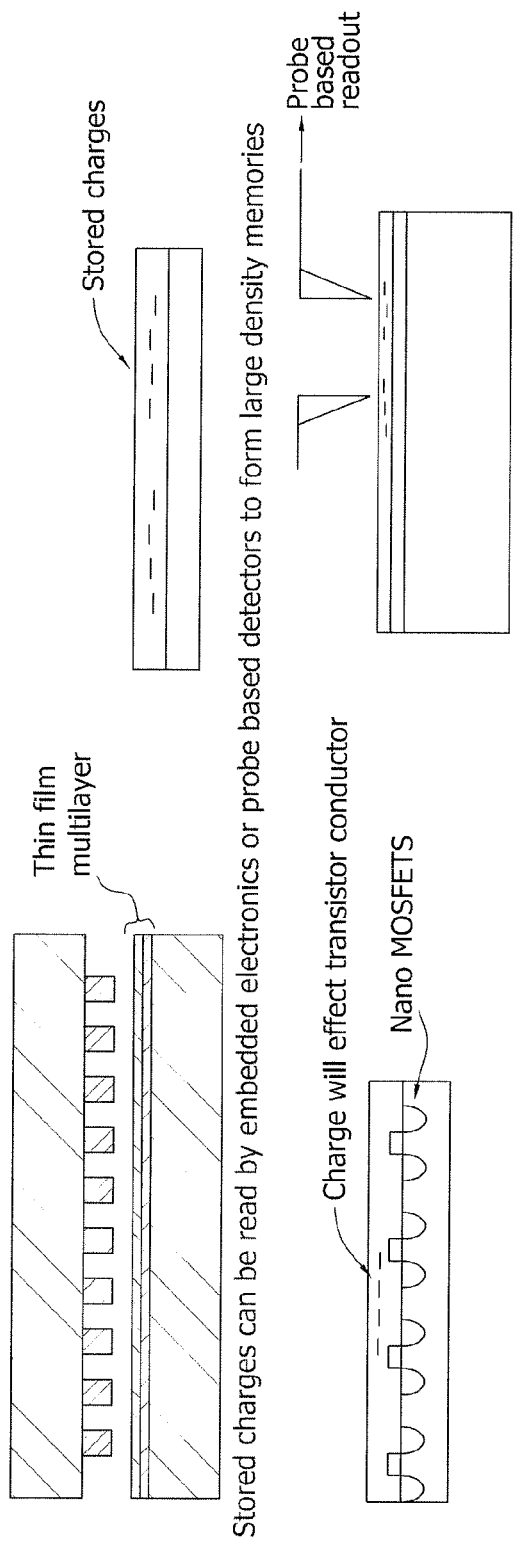
FIG. 10B is schematic cross sectional diagram, in elevation, illustrating a lithography system with electron/alpha surface charging, in accordance with the method of the present invention.
Figure 10C:
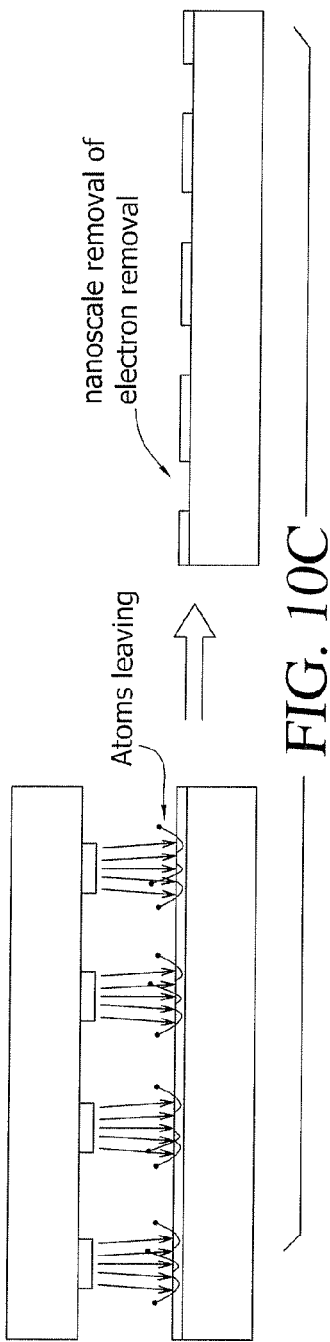
FIG. 10C is schematic cross sectional diagram, in elevation, illustrating an X-ray lithography system, in accordance with the method of the present invention.
Figure 10D:
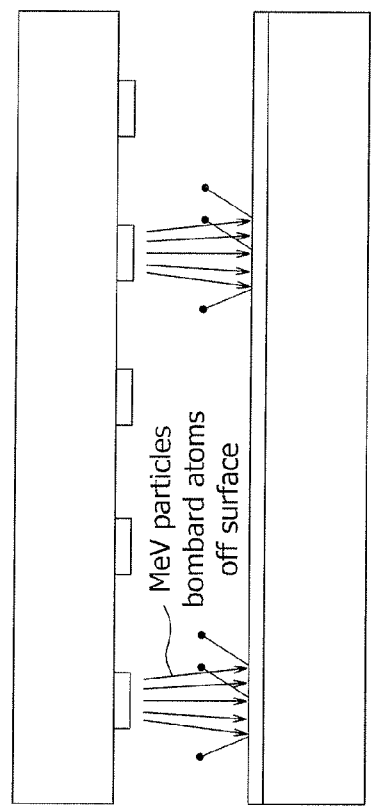
FIG. 10D is schematic cross sectional diagram, in elevation, illustrating physical sputtering, in accordance with the method of the present invention.
Figure 10E:
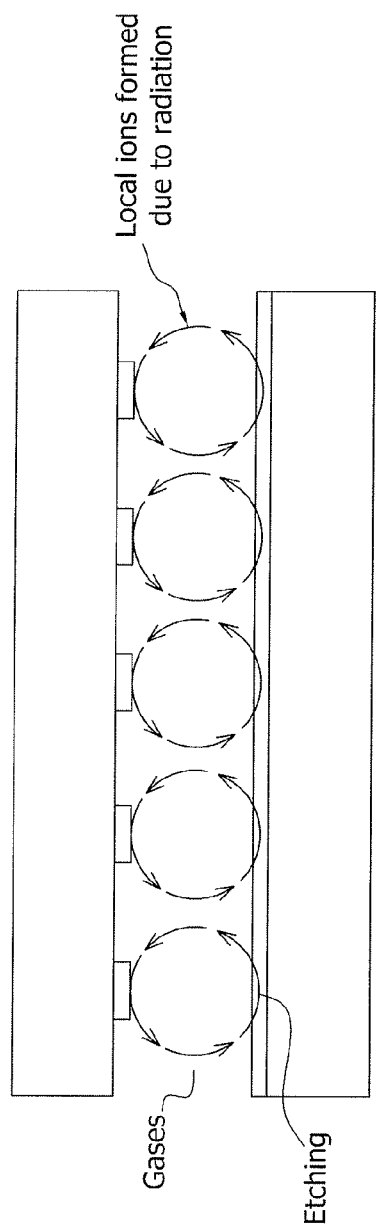
FIG. 10E is schematic cross sectional diagram, in elevation, illustrating reactive ion etching, in accordance with the method of the present invention.

Several radioisotope sources seem promising. FIG. 9A is schematic cross sectional diagram, in elevation, illustrating a direct contact lithography system 600 using a $^3H$ thin film emitter 610 and an Au stencil or mask 630 to provide sub-100 nm features, using the method of the present invention. FIG. 9B is a plot of E distribution for the beta decay of the $^3H$ thin film emitter of FIG. 9A, in accordance with the method of the present invention. As seen in FIG. 9C, (a histogram plot for exposure time as a function of exposure area, illustrating times for different isotopes) the development time with different isotopes make this method superior to others in throughput and cost, and the exposure time is significantly shorter than for E-beam lithography.

Additional Considerations

Radioactive thin films (e.g., as in source carrier 110) produce high energy particles via radioactive decay. Gamma-rays (high energy x-rays), alpha particles (helium nucleus), and beta particles (electrons) are emitted either by themselves or in some combination. For example, nickel-63 thin films are pure beta emitting films with electron energy emission of approximately 3-77 keV with average energy of 17 keV. Polonium-210 is a pure alpha emitter with energies in the few MeV range. The emission of the particles from radioactive atoms is generally isotropic, but if put in thin films, it becomes more accentuated in the direction normal to the wafer surface.

The overall claim that this application makes is that the energies emitted in the form of alpha-particles, beta particles, gamma-rays can be used to modify surfaces and the gases around the surfaces to enable surface and sub-surface thin film processing.

Nanometer scale patterning of radioactive films is feasible either by directly patterning the films or by radiating particles from a uniform film through a nanoscale mask made on another substrate. One of the big advantages of this technique is that the radioactive patterned mask can be made arbitrarily large allowing integrated circuits to be defined in a wide range of sizes for a variety of applications.

Table 2 below summarizes the different ways in which one can envision using radioactive thin films for processing.

TABLE 2

(see FIGS. 10A-10E)

| Process | Physical mechanism | Advantages | Disadvantages |
| --- | --- | --- | --- |
| Electron-lithography (FIG. 10A) | Beta-emitting films can expose photo resist to high energy electrons | No electron beam column needed, large area surfaces can be defined | The emission of electrons in many directions may require nonlinear photoresists to enable good edge roughness |
| Electron/alpha surface charging (FIG. 10B) | Electrons and alpha particles get embedded nanometers to micrometers below surface to effectively modify chemical and electrical properties of the surfaces. | This can be done on curved large area surfaces to define nanoscale features on large areas. Charge writing can be used to implement very high density memories by transistor or probe based reading. | Surface uniformity |
| X-ray lithography (FIG. 10A) | Gamma particles expose surfaces | No x-ray accelerator needed | X-ray energy should be choosen to be low enough that it is mostly absorbed by the PR and the surface it sits on. |
| Electron-based etching (FIG. 10C) | Electron impingement from radioactive thin films will sputter thin layers | Low energy betas might enable atomically thin film layers to be removed allowing nanoscale and repeatable etching, a capability not possible at present. | Stochastic nature of flux may cause surface roughness |
| Physical sputtering (FIG. 10D) | Alpha/beta/gamma particles contain mega electron volts of kinetic energy that can easily dislodge atoms from surfaces. | MeV energies require accelerators which are expensive. Simple alpha-emitting thin films can sputter locally. This processing can be done locally using a probe based - i.e. a micro nanoprobe can locally apply the high energy flux. This capability would allow local removal and etching of thin films for IC interrogation. This capability today is done using large focused ion beam systems. | |
| Reactive ion etching (FIG. 10E) | The radioactive thin film emitted particles ionize gases, with the ions then reacting with thin films | Smaller reaction chambers with much more efficient plasma formation with less secondary reaction with buffer gases required for plasma triggering | Will need to get higher pressure reactive gases for close-proximity etching |

The proposed lithography system can be used economically for an extended service life. As noted above, stencil 130 can then be stripped from emitter substrate 110, and radioisotope source 112 can be reused with other stencils for writing other patterns. The half-life of Pm-147 is 2.8 years, so a single emitter substrate could expose thousands of target substrates over a service life measured in years.

One particular application of the radioactive lithography of the present invention is the development of nano-scale lithography for flat panel electronics, which is currently focused on displays. Lithography for such large displays is restricted to micron scale or barely sub-micron dimensions as stitched optical lithography or contact optical lithography is used. This limits the number of transistors that can be made per unit area. Currently only a few transistors are implemented per pixel of a flat display. If many more transistors could be fit in the same space, highly intelligent pixel feedback control may be implemented, or in general computers could be fabricated in parallel on the same substrate so that display and computer are on same substrate, eliminating cost associated with different chips and packaging. Large area nanoscale radioactive lithography can push the flat-panel lithography to same dimensions found on state-of-art microprocessors and memory, and by doing so, enables new possibilities of integrating different functions of a computer on one substrate.

Accordingly, since the emitter substrate and target substrates of the present invention can be made arbitrarily large, persons of skill in the art will readily understand that the system and method of the present invention are readily adapted for use on target substrates for use in large displays, including those conforming to the Gen 10 standard for LCD displays (e.g., having an area of ~8.7 m$^2$) or the upcoming Gen 11 standard (with an area of ~3200 mm×3600 mm or ~11.5 m$^2$), and for each of those embodiments, the active region of the emitter substrate (e.g., 112), the resist-covered area of the target substrate (e.g., 122) and stencil or masking layer (e.g., 130) are each going to have a substantially equivalent area (e.g., each ~3200 mm×3600 mm), in accordance with the present invention.

Those having skill in the art will appreciate that the exemplary embodiments disclosed here make self-powered near-field or contact lithography systems a practical reality for a variety of applications, and in a wide range of sizes. Having described preferred embodiments of a new and improved lithography system and method, it is believed that other modifications, variations and changes will be suggested to those skilled in the art in view of the teachings set forth herein. It is therefore to be understood that all such variations, modifications and changes are believed to fall within the scope of the present invention, as set forth in the following claims.

What is claimed is:

1. A lithography system for modifying the surface of a substrate to be used in fabricating semiconductor circuits or nano-scale electro-mechanical devices, comprising:
   a first emitter substrate including a radioisotope;
   a second target substrate;
   a stencil positioned between said first and second substrates comprising a material capable of blocking particles emitted through radioactive decay from said radioisotope of the first substrate;
   wherein said stencil includes one or more vias defining a selected exposure pattern to permit selective transmission of particles emitted through radioactive decay from said radioisotope of the first substrate; and
   wherein said stencil is proximate to said second substrate.

2. The lithography system of claim 1, wherein said second substrate comprises a layer of energy-modifiable material that is modified in response to exposure to said emitted particles.

3. The lithography system of claim 1, wherein said second substrate's layer of energy-modifiable material comprises a layer of photo-resist that is sensitive to said emitted particles.

4. The lithography system of claim 2, wherein said emitted particles are beta particles.

5. The lithography system of claim 1, wherein said radioisotope is configured as a thin film layer on a surface of said first substrate.

6. The lithography system of claim 1, wherein said second substrate is made from silicon.

7. The lithography system of claim 1, wherein said second substrate is made from glass.

8. The lithography system of claim 1, wherein said second substrate is made from $SiO_2$.

9. The lithography system of claim 2, wherein said second target substrate is modified by said particles where said second substrate is exposed to said particles.

10. A method for near field lithography using radioisotope emitted particles to expose a substrate to be used in fabricating semiconductor circuits or micro- and nano-scale electro-mechanical devices, comprising:
   (a) providing a first emitter substrate including a radioisotope;
   (b) providing a second target substrate to be exposed;
   (c) providing a stencil comprising a material capable of blocking particles emitted through radioactive decay from said radioisotope of the first substrate, said stencil including vias defining a selected exposure pattern;
   (d) positioning said stencil between said first substrate and said second substrate to be exposed such that particles emitted from said radioisotope of the first substrate will impinge upon said stencil, pass through vias patterned in said stencil and then impinge on said second substrate;
   (e) affixing said stencil and said second substrate proximate to one another in order that particles emitted through radioactive decay from said radioisotope of the first substrate selectively expose portions of said second substrate in said exposure pattern; and
   (f) maintaining the positioning of said first substrate, said stencil, and said second substrate for a period of time necessary for said particles emitted through radioactive decay from said radioisotope of the first substrate to achieve a desired exposure effect on said second substrate.

11. The method of claim 10, further comprising the step of removing selected resist material after exposure to said emitted particles on said second target substrate using a resist developer to create a pattern of etched grooves or gaps on said target substrate.

12. A lithography system for fabricating semiconductor circuits, micro-scale electro-mechanical devices or nano-scale electro-mechanical devices on a substrate or wafer to be exposed, comprising:
   a self-powered emitter substrate including a radioactive film configured to continuously generate energized particles in a pre-defined exposure pattern;
   a target substrate including a modifiable surface that will be modified when exposed to said energized particles;
   wherein said emitter substrate and said target substrate are placed in close proximity to one another when said target substrate is to be exposed;
   further comprising a stencil having vias defining said predefined exposure pattern, and wherein said emitter substrate's energized particles pass through said stencil only through said vias.

13. The lithography system of claim 12, wherein said radioactive film generates alpha particles.

14. The lithography system of claim 12, wherein said radioactive film generates beta particles.

15. The lithography system of claim 12, wherein said target substrate's modifiable surface comprises a layer of photo-resist that is modified when exposed to said energized particles.

16. The lithography system of claim 12, wherein said target substrate is made of glass.

17. The lithography system of claim 12, wherein said target substrate comprises a silicon wafer.

18. The lithography system of claim 12, wherein said target substrate is made of quartz.

19. A lithography system for fabricating semiconductor circuits or nano-scale electro-mechanical devices on a substrate or wafer to be exposed, comprising:
   a self powered emitter substrate electron generator continuously and spontaneously emitting energetic electrons in a selected exposure pattern from a radioisotope thin-film segment; and
   a target substrate carrying an electron sensitive photo resist;
   wherein said electron emission from said emitter substrate is masked using a nano-stencil patterned with vias in said selected exposure pattern and affixed to said target substrate.

20. The lithography system of claim 19, wherein said emitter substrate is adapted for use to expose a large number of wafers and will remain self-powered for an interval exceeding two years.

21. The lithography system of claim 19, wherein said system is used to expose a large number of wafers without incurring any additional cost, thereby providing a low-cost nano-lithography system capable of providing resolution in the range of 300 nm minimum feature size on large areas (1-100 cm$^2$).

22. A method for making a display panel using near field lithography with radioisotope emitted particles to expose a substrate to be used in fabricating a solid-state display, comprising:
   (a) providing an emitter substrate including a radioisotope, said emitter substrate having a selected area;

(b) providing a target substrate to be exposed; said target substrate being substantially rectangular and having an exposure area that is substantially the same as said emitter substrate's selected area;

(c) providing a stencil comprising a material capable of blocking particles emitted through radioactive decay from said radioisotope of the first substrate, said stencil including vias defining a selected exposure pattern, wherein said stencil's exposure pattern is sized to fit within said target substrate's exposure area;

(d) positioning said stencil between said emitter substrate and said target substrate to be exposed when particles emitted from said emitter substrate's radioisotope impinge upon said stencil, pass through vias patterned in said stencil and then impinge on said target substrate;

(e) affixing said stencil and said target substrate proximate to one another in order that particles emitted through radioactive decay from said radioisotope selectively expose portions of said target substrate in said exposure pattern; and (f) maintaining the positioning of said emitter substrate, said stencil, and said target substrate for a period of time necessary for said particles emitted through radioactive decay from said radioisotope to achieve a desired exposure effect on said target substrate to render an exposed area on said target substrate that is configured for use in defining display circuitry, and wherein said exposed area on said target substrate defines a rectangle of up to 3200 mm by 3600 mm.

23. A method for near field lithography using radioisotope emitted particles to expose a target, which can be used in fabricating semiconductor circuits or micro- and nano-scale electro-mechanical devices, comprising:

providing an emitter layer comprising a layer of material adapted to emit radioisotope particles;

providing a target material layer to be exposed to at least some of the particles emitted from the emitter layer;

providing a stencil layer having a patterned plurality of openings or vias intermediate the emitter layer and the target layer, wherein the stencil layer is a material that is capable of blocking the particles emitted from the emitter layer; and exposing at least a portion of the target layer to at least some of the particles emitted from the emitter layer that are transmitted through the patterned plurality of openings or vias in the stencil layer.

24. The method of claim 23, wherein the stencil layer and the target layer are fixed in relative position to one another.

25. The method of claim 24, further comprising moving the emitter layer relative to the stencil layer and the target layer.

* * * * *